United States Patent
Vogel

(10) Patent No.: US 7,017,390 B1
(45) Date of Patent: Mar. 28, 2006

(54) PROXIMITY SENSOR NOZZLE SHROUD WITH FLOW CURTAIN

(75) Inventor: Herman Vogel, Sandy Hook, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 11/005,246

(22) Filed: Dec. 7, 2004

(51) Int. Cl.
G01B 13/08 (2006.01)

(52) U.S. Cl. ........................................................ 73/37.5
(58) Field of Classification Search ................ 73/37.5, 73/37.6, 37.9
See application file for complete search history.

(56) References Cited

U.S. PATENT DOCUMENTS

| | | | | |
|---|---|---|---|---|
| 2,986,924 A | | 6/1961 | Becker ......................... | 73/37.5 |
| 3,026,714 A | | 3/1962 | Evans et al. ................... | 73/37.7 |
| 3,127,764 A | * | 4/1964 | Hudson ....................... | 73/37.5 |
| 3,433,408 A | | 3/1969 | Bellman et al. ............. | 235/201 |
| 3,482,433 A | * | 12/1969 | Gladwyn ..................... | 73/37.5 |
| 3,545,256 A | * | 12/1970 | Beeken ....................... | 73/37.5 |
| 3,709,027 A | * | 1/1973 | Beeken ....................... | 73/37.5 |
| 3,792,609 A | | 2/1974 | Blair et al. .................... | 73/205 |
| 3,881,357 A | * | 5/1975 | Sahlin ......................... | 73/37.5 |
| 3,942,556 A | * | 3/1976 | Wojcikowski .............. | 137/804 |
| 4,041,584 A | | 8/1977 | Williamson .................. | 28/269 |
| 4,179,919 A | | 12/1979 | McKechnie ................. | 73/37.5 |
| 4,187,715 A | | 2/1980 | Nevitt ......................... | 73/37.9 |
| 4,421,970 A | * | 12/1983 | Couch, Jr. .............. | 219/121.56 |
| 4,458,519 A | * | 7/1984 | Day et al. ....................... | 73/37 |
| 4,550,592 A | | 11/1985 | Dechape ..................... | 73/37.5 |
| 4,583,917 A | | 4/1986 | Shah ............................ | 417/63 |
| 4,953,388 A | | 9/1990 | Barada ........................ | 73/37.5 |
| 4,971,517 A | | 11/1990 | Perkey et al. ................. | 415/14 |
| 5,022,258 A | * | 6/1991 | Wilson ........................ | 73/37.5 |
| 5,184,503 A | | 2/1993 | Hancock ..................... | 73/37.5 |
| 5,317,898 A | | 6/1994 | Nemeth ...................... | 73/37.7 |
| 5,540,082 A | | 7/1996 | Okuyama et al. ............ | 73/37.5 |
| 6,152,162 A | | 11/2000 | Balazy et al. ............... | 137/110 |
| 6,244,121 B1 | | 6/2001 | Hunter ....................... | 73/865.9 |

FOREIGN PATENT DOCUMENTS

| | | |
|---|---|---|
| GB | 1 399 397 | 10/1972 |
| JP | 57-191507 | 11/1982 |

OTHER PUBLICATIONS

Burrows, V.R., "The Principles and Application of Pneumatic Guaging," FWP Journal, Oct. 1976, pp 31-42.

(Continued)

Primary Examiner—Hezron Williams
Assistant Examiner—John Fitzgerald
(74) Attorney, Agent, or Firm—Sterne, Kessler, Goldstein & Fox, P.L.L.C.

(57) ABSTRACT

The present invention is directed to an apparatus for reducing the impact of cross winds on gas flow emitted from a nozzle. The apparatus includes a shroud that affixes to the nozzle. A plenum is located inside the shroud that holds a shroud gas, which is fed into the plenum through one or more intake holes. The shroud gas is emitted out through a series of openings, such as holes or slots, along a bottom surface of the shroud in a direction away from the nozzle. The shroud gas that is emitted forms an air curtain around the nozzle to prevent cross winds from impacting the flow of gas out of the nozzle. In one application, the apparatus is used with a lithography gas gauge proximity sensor. The apparatus can also be used with nozzles that emit liquids, such as, for example, an immersion lithography proximity sensor.

11 Claims, 4 Drawing Sheets

OTHER PUBLICATIONS

Derwent Abstract Accession No. 86-324714/49, SU 1225634 A (Kiev Autom Inst) Apr. 23, 1986.

Pending U.S. Appl. No. 10/322,768, filed Dec. 19, 2002, Gajdeczko et al., High Resolution Gas Gauge Proximity Sensor.

Pending U.S. Appl. No. 10/683,271, filed Oct. 14, 2003, Violette, Kevin, Liquid Flow Proximity Sensor for Use in Immersion Lithography.

Pending U.S. Appl. No. 10/646,720, filed Aug. 25, 2003, Joesph Lyons. High Resolution Gas Gauge Proximity Sensor.

Pending U.S. Appl. No. 10/894,028, filed Jul. 20, 2004, Galburt et al. Fluid Gauge Proximity Sensor and Method of Operating Same Using a Modulated Fluid Flow.

Pending U.S. Appl. No. 10/854,429, filed May 27, 2004, Ebert et al., Gas Gauge Proximity Sensor with a Modulated Gas Flow.

Pending U.S. Appl. No. 10/833,249, filed Apr. 28, 2004, Carter et al., High Resolution Gas Gauge Proximity Sensor. Proximity Sensor with Self Compensation for Mechanism Instability, filed Dec. 17, 2004, by Peter Kochersperger.

* cited by examiner

Bottom View

Cross Section at A-A

PROXIMITY SENSOR NOZZLE SHROUD WITH FLOW CURTAIN

BACKGROUND OF THE INVENTION

1. Field of the Invention

The present invention relates to lithography, and more particularly, to lithography gas gauges.

2. Background of Invention

Many automated manufacturing processes require the sensing of the distance between a manufacturing tool and the product or material surface being worked. In some situations, such as semiconductor lithography, the distance must be measured with accuracy approaching a nanometer.

The challenges associated with creating a proximity sensor of such accuracy are significant, particularly in the context of photolithography systems. In the photolithography context, in addition to being non-intrusive and having the ability to precisely detect very small distances, the proximity sensor can not introduce contaminants or come in contact with the work surface, typically a semiconductor wafer. Occurrence of either situation may significantly degrade or ruin the semiconductor quality.

Different types of proximity sensors are available to measure very small distances. Examples of proximity sensors include capacitance and optical gauges. These proximity sensors have serious shortcomings when used in photolithography systems because physical properties of materials deposited on wafers may impact the precision of these devices. For example, capacitance gauges, being dependent on the concentration of electric charges, can yield spurious proximity readings in locations where one type of material (e.g., metal) is concentrated. Another class of problems occurs when exotic wafers made of non-conductive and/or photosensitive materials, such as Gallium Arsenide (GaAs) and Indium Phosphide (InP), are used. In these cases, capacitance and optical gauges may provide spurious results.

U.S. Pat. No. 4,953,388, entitled Air Gauge Sensor, issued Sep. 4, 1990 to Andrew Barada ("'388 patent"), and U.S. Pat. No. 4,550,592, entitled Pneumatic Gauging Circuit, issued Nov. 5, 1985 to Michel Deschape ("'592 patent"), disclose an alternative approach to proximity sensing that uses an air gauge sensor. U.S. Pat. Nos. 4,953,388 and 4,550,592 are incorporated herein in their entireties. Furthermore, principles of pneumatic gauging are discussed in Burrows, V. R., *The Principles and Applications of Pneumatic Gauging*, FWP Journal, October 1976, pp. 31–42, which is incorporated herein in its entirety. An air gauge sensor is not vulnerable to concentrations of electric charges or electrical, optical and other physical properties of a wafer surface. Current semiconductor manufacturing, however, requires that proximity is gauged with high precision on the order of nanometers. Earlier versions of air gauge sensors, however, often do not meet today's lithography requirements for precision.

Co-pending, commonly owned U.S. patent application Ser. No. 10/322,768, entitled High Resolution Gas Gauge Proximity Sensor, filed Dec. 19, 2002 by Gajdeczko et al., ("'768 patent application") describes a high precision gas gauge proximity sensor that overcomes some of the precision limitations of earlier air gauge proximity sensors. The 768 patent application, which is incorporated herein in its entirety, describes a gas gauge proximity sensor that provides a high degree of accuracy. Similarly, co-pending, commonly owned U.S. patent application Ser. No. 10/683, 271, entitled Liquid Flow Proximity Sensor for Use in Immersion Lithography, filed Oct. 14, 2003, by Violette, Kevin, ("'271 patent application") describe a high precision immersion lithography proximity sensor that provides a high degree of precision in an immersion lithography application.

While the sensors disclosed in the '768 and '271 patent applications provide a high degree of precision, the precision can be impacted by cross flows of gas or liquid that intersect the stream of gas or liquid that is being emitted from a measurement channel of the proximity sensor. Specifically, purging gases, for example, can exhibit local cross winds with velocities of the order of a few meters per second. Cross-winds or cross-flows will cause gauge instability and drift, introducing non-calibratable errors within proximity sensors.

What is needed is an apparatus to neutralize these crossflows to improve the accuracy of proximity sensors.

SUMMARY OF THE INVENTION

The present invention is directed to an apparatus for reducing the impact of cross winds on gas flow emitted from a nozzle. The apparatus includes a shroud that affixes to the nozzle. A plenum is located inside the shroud that holds a shroud gas, which is fed into the plenum through one or more intake holes. The shroud gas is emitted out through a series of openings, such as holes or slots, along a bottom surface of the shroud in a direction away from the nozzle. The shroud gas that is emitted forms an air curtain around the nozzle to prevent cross winds from impacting the flow of gas out of the nozzle. In one application, the apparatus is used with a lithography proximity sensor. In this application, the shroud is affixed to a measurement nozzle to reduce cross winds impacting the precision of the proximity sensor. Use of the apparatus improves the proximity sensor precision. The apparatus can also be used with nozzles that emit liquids, such as, for example, in an immersion lithography proximity sensor.

Further embodiments, features, and advantages of the invention, as well as the structure and operation of the various embodiments of the invention are described in detail below with reference to accompanying drawings.

BRIEF DESCRIPTION OF THE FIGURES

The invention is described with reference to the accompanying drawings. In the drawings, like reference numbers indicate identical or functionally similar elements. The drawing in which an element first appears is indicated by the left-most digit in the corresponding reference number.

DETAILED DESCRIPTION OF THE INVENTION

Figure 1:
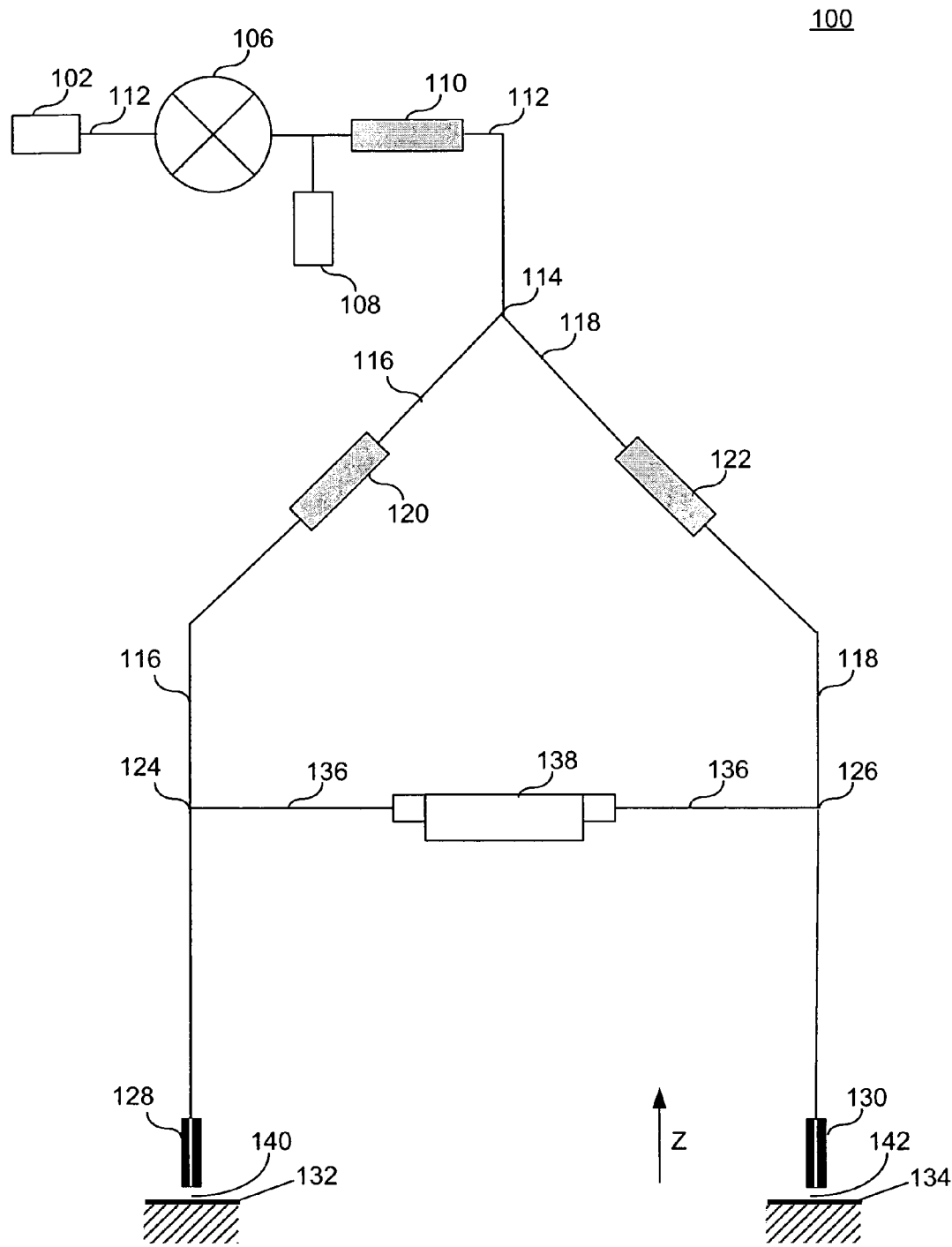
FIG. 1 is a schematic diagram showing the functional components of a proximity sensor.

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the invention would be of significant utility FIG. 1 illustrates gas gauge proximity sensor 100, according to an embodiment of the present invention. Gas gauge proximity sensor 100 includes mass flow controller 106, central channel 112, measurement channel 116, reference channel 118, measurement channel restrictor 120, reference channel restrictor 122, measurement probe 128, reference probe 130, bridge channel 136 and mass flow sensor 138. Gas supply 102 injects gas at a desired pressure into gas gauge proximity sensor 100.

Central channel 112 connects gas supply 102 to mass flow controller 106 and then terminates at junction 114. Mass flow controller 106 maintains a constant flow rate within gas gauge proximity sensor 100. Gas is forced out from mass flow controller 106 through a porous snubber 110, with an accumulator 108 affixed to channel 112. Snubber 110 reduces gas turbulence introduced by the gas supply 102, and its use is optional. Upon exiting snubber 110, gas travels through central channel 112 to junction 114. Central channel 112 terminates at junction 114 and divides into measurement channel 116 and reference channel 118. Mass flow controller 106 injects gas at a sufficiently low rate to provide laminar and incompressible fluid flow throughout the system to minimize the production of undesired pneumatic noise. Likewise, the system geometry can be appropriately sized to maintain the laminar flow characteristics established by mass flow controller 106.

Bridge channel 136 is coupled between measurement channel 116 and reference channel 118. Bridge channel 136 connects to measurement channel 116 at junction 124. Bridge channel 136 connects to reference channel 118 at junction 126. In one example, the distance between junction 114 and junction 124 and the distance between junction 114 and junction 126 are equal.

All channels within gas gauge proximity sensor 100 permit gas to flow through them. Channels 112, 116, 118, and 136 can be made up of conduits (tubes, pipes, etc.) or any other type of structure that can contain and guide gas flow through sensor 100. The channels do not have sharp bends, irregularities or unnecessary obstructions that may introduce pneumatic noise, for example, by producing local turbulence or flow instability. The overall lengths of measurement channel 116 and reference channel 118 can be equal or in other examples can be unequal.

Reference channel 118 terminates into reference nozzle 130. Likewise, measurement channel 116 terminates into measurement nozzle 128. Reference nozzle 130 is positioned above reference surface 134. Measurement nozzle 128 is positioned above measurement surface 132. In the context of photolithography, measurement surface 132 is often a semiconductor wafer or stage supporting a wafer. Reference surface 134 can be a flat metal plate, but is not limited to this example. Gas injected by gas supply 102 is emitted from each of the nozzles 128, 130 and impinges upon measurement surface 132 and reference surface 134. As stated above, the distance between a nozzle and a corresponding measurement or reference surface is referred to as a standoff.

Measurement channel restrictor 120 and reference channel restrictor 122 serve to reduce turbulence within the channels and act as a resistive element. In other embodiments, orifices can be used. Although orifices will not reduce turbulence.

In one embodiment, reference nozzle 130 is positioned above a fixed reference surface 134 with a known reference standoff 142. Measurement nozzle 128 is positioned above measurement surface 132 with an unknown measurement standoff 140. The known reference standoff 142 is set to a desired constant value representing an optimum standoff. With such an arrangement, the backpressure upstream of the measurement nozzle 128 is a function of the unknown measurement standoff 140; and the backpressure upstream of the reference nozzle 130 is a function of the known reference standoff 142. If standoffs 140 and 142 are equal, the configuration is symmetrical and the bridge is balanced. Consequently, there is no gas flow through bridging channel 136. On the other hand, when the measurement standoff 140 and reference standoff 142 are different, the resulting pressure difference between the measurement channel 116 and the reference channel 118 induces a flow of gas through mass flow sensor 138.

Mass flow sensor 138 is located along bridge channel 136, preferably at a central point. Mass flow sensor 136 senses gas flows induced by pressure differences between measurement channel 116 and reference channel 118. These pressure differences occur as a result of changes in the vertical positioning of measurement surface 132. For a symmetric bridge, when measurement standoff 140 and reference standoff 142 are equal, the standoff is the same for both of the nozzles 128, 130 compared to surfaces 132, 134. Mass flow sensor 138 will detect no mass flow, since there will be no pressure difference between the measurement and reference channels. Differences between measurement standoff 140 and reference standoff 142 will lead to different pressures in measurement channel 116 and reference channel 118. Proper offsets can be introduced for an asymmetric arrangement.

Mass flow sensor 138 senses gas flow induced by a pressure difference or imbalance. A pressure difference causes a gas flow, the rate of which is a unique function of the measurement standoff 140. In other words, assuming a constant flow rate into gas gauge 100, the difference between gas pressures in the measurement channel 116 and the reference channel 118 is a function of the difference between the magnitudes of standoffs 140 and 142. If reference standoff 142 is set to a known standoff, the difference between gas pressures in the measurement channel 116 and the reference channel 118 is a function of the size of measurement standoff 140 (that is, the unknown standoff in the z direction between measurement surface 132 and measurement nozzle 128).

Mass flow sensor 138 detects gas flow in either direction through bridge channel 136. Because of the bridge configuration, gas flow occurs through bridge channel 136 only when pressure differences between channels 116, 118 occur. When a pressure imbalance exists, mass flow sensor 138 detects a resulting gas flow, and can initiate an appropriate control function. Mass flow sensor 138 can provide an indication of a sensed flow through a visual display or audio indication. Alternatively, in place of a mass flow sensor, a differential pressure sensor may be used. The differential pressure sensor measures the difference in pressure between the two channels, which is a function of the difference between the measurement and reference standoffs.

Proximity sensor 100 is provided as one example of a device with a nozzle that can benefit from the present invention. The invention is not intended to be limited to use with only proximity sensor 100. Rather the invention can be used with other types of proximity sensors, as well as other nozzles that emit gases or liquids in which the flow of the emitted gas or liquid needs to be protected from cross winds or cross currents.

Figure 2:
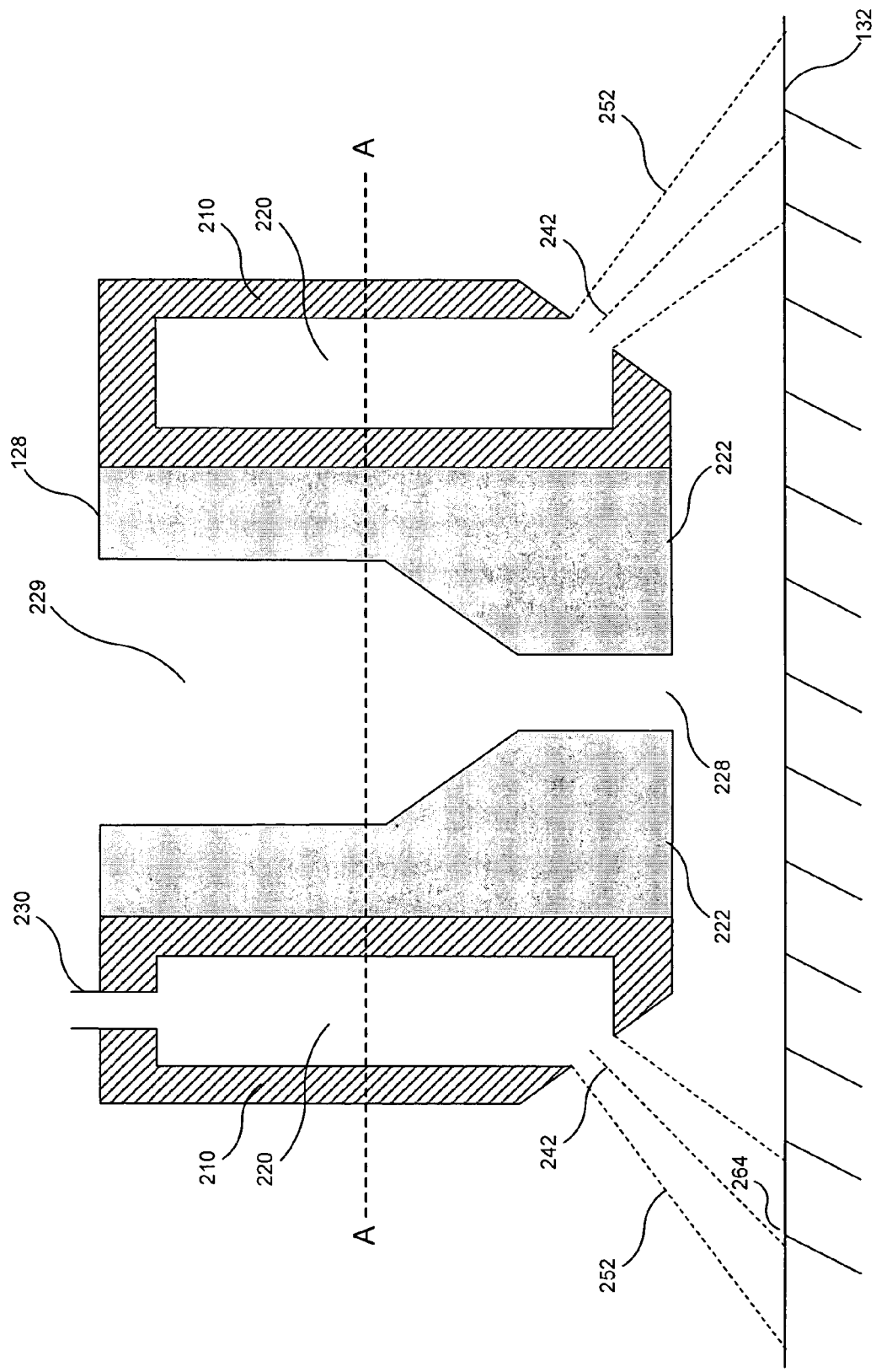
FIG. 2 is a diagram of a proximity sensor nozzle having a shroud with a flow curtain, according to an embodiment of the invention.

FIG. 2 is a diagram of a vertical cross section of proximity sensor measurement nozzle 128 having shroud 210 with a flow curtain, according to an embodiment of the invention. Measurement nozzle 128 includes channel 229 and opening 228. As discussed above, gas will flow through channel 229 and exit measurement nozzle 128 through opening 228. The gas impinges on measurement surface 132, and based on the amount of backpressure within proximity sensor 100 a measurement of the standoff 140 can be estimated.

When cross-winds flow through the area around standoff 140, the cross-winds will impact the amount of backpressure and degrade the precision of proximity sensor 100. Typically, cross-winds only impact measurement standoffs, as reference standoffs are often sheltered by enclosed area that eliminates cross-winds. Thus, the invention focuses on using a shroud on a measurement nozzle. However, the invention is not limited to this case. The shroud can be used on any type of nozzle in which protection against cross-winds or cross currents of fluids need to be reduced.

Measurement nozzle 128 is surrounded by shroud 210. Shroud 210 is made of materials that are suitable for a lithography environment, or other environment in which the shroud is being used. The specific types of acceptable materials will be known to individuals skilled in the relevant arts based on the teachings herein.

In embodiments shroud 210 can be affixed to measurement nozzle 128 by use of a fastener, glue, epoxy or the like. In an embodiment shroud 210 substantially circumscribes measurement nozzle 128. In another embodiment, measurement nozzle 128 and shroud 210 can be machined as a single structure. In a further embodiment, shroud 210 can be snapped around measurement nozzle 128 and held in place by a small latch on shroud 210.

Shroud 210 includes plenum 220 that serves as a reservoir to hold a shroud gas. In the case of an immersion lithography proximity sensor, plenum 220 holds a shroud liquid. Shroud 230 includes an intake hole 230, which allows shroud gas to be emitted into plenum 220. A series of holes, such as holes 242 and 244 exist along a lower surface of shroud 210, such that the holes emit the shroud gas in a direction away from measurement nozzle 120 to form a gas curtain. In an alternate embodiment, slots can be used in place of the holes. Parameters, such as the number of holes, angle of the holes, diameter of the holes and velocity of gas being emitted are adjusted, such that an integrally continuous gas curtain is created around the lower portion of shroud 210.

The holes project cones of shroud gas having an arrival velocity at point 264, such that the horizontal components of the shroud gas flow arrival velocity is equal to or greater than the horizontal components of cross winds. Arrival point 264 represents the intersection of the centerline of a shroud gas cone, such as shroud gas cone 252 and 254, and measurement surface 132. FIG. 2 illustrates shroud gas cone 254, which is emitted from hole 244 and shroud gas cone 252, which is emitted from hole 242.

Figure 3:
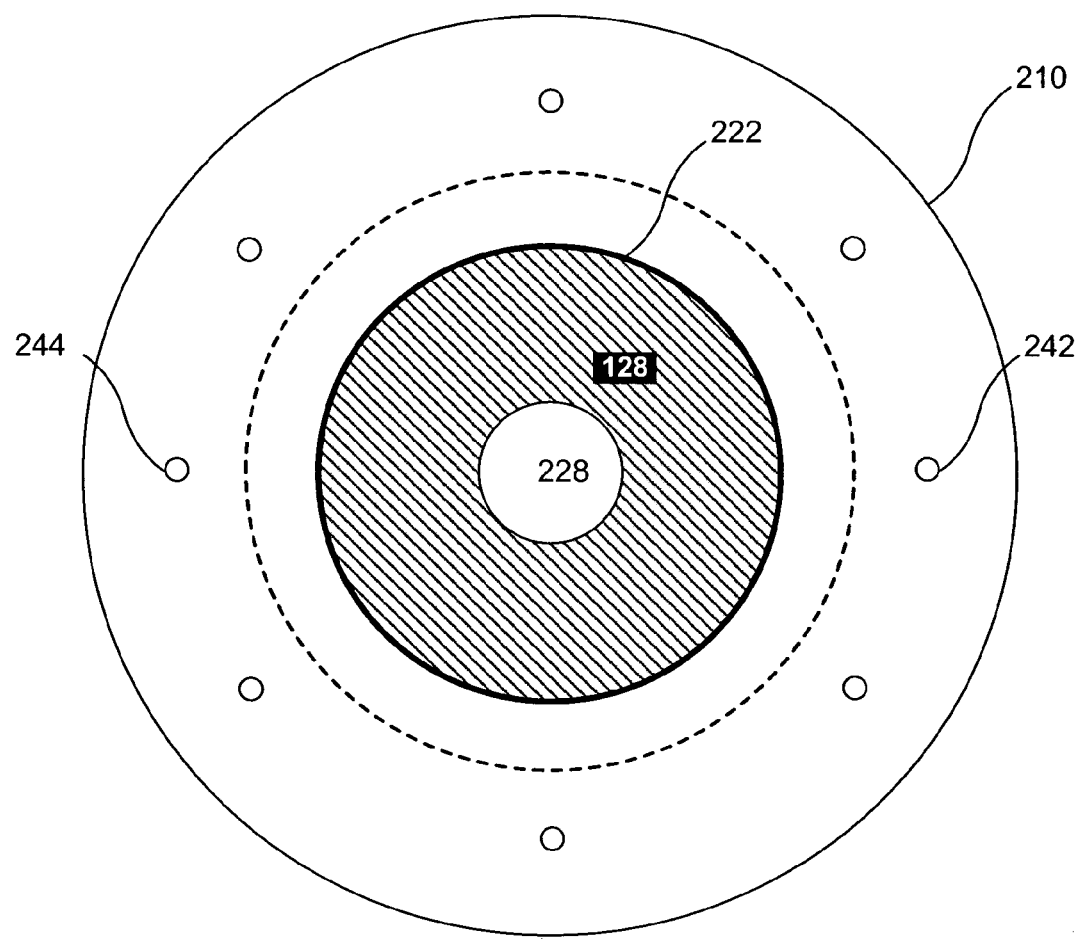
FIG. 3 is a diagram of a bottom view of a proximity sensor nozzle having a shroud that produces a flow curtain, according to an embodiment of the invention.

FIG. 3 is a diagram of a bottom view of measurement nozzle 128 and shroud 210. Nozzle opening 228 appears at the center of the diagram, surrounded by measurement nozzle 128. Interface 222 represents the interface between measurement nozzle 128 and shroud 210. In this example, shroud 210 includes eight holes, such as holes 242 and 244.

Figure 4:
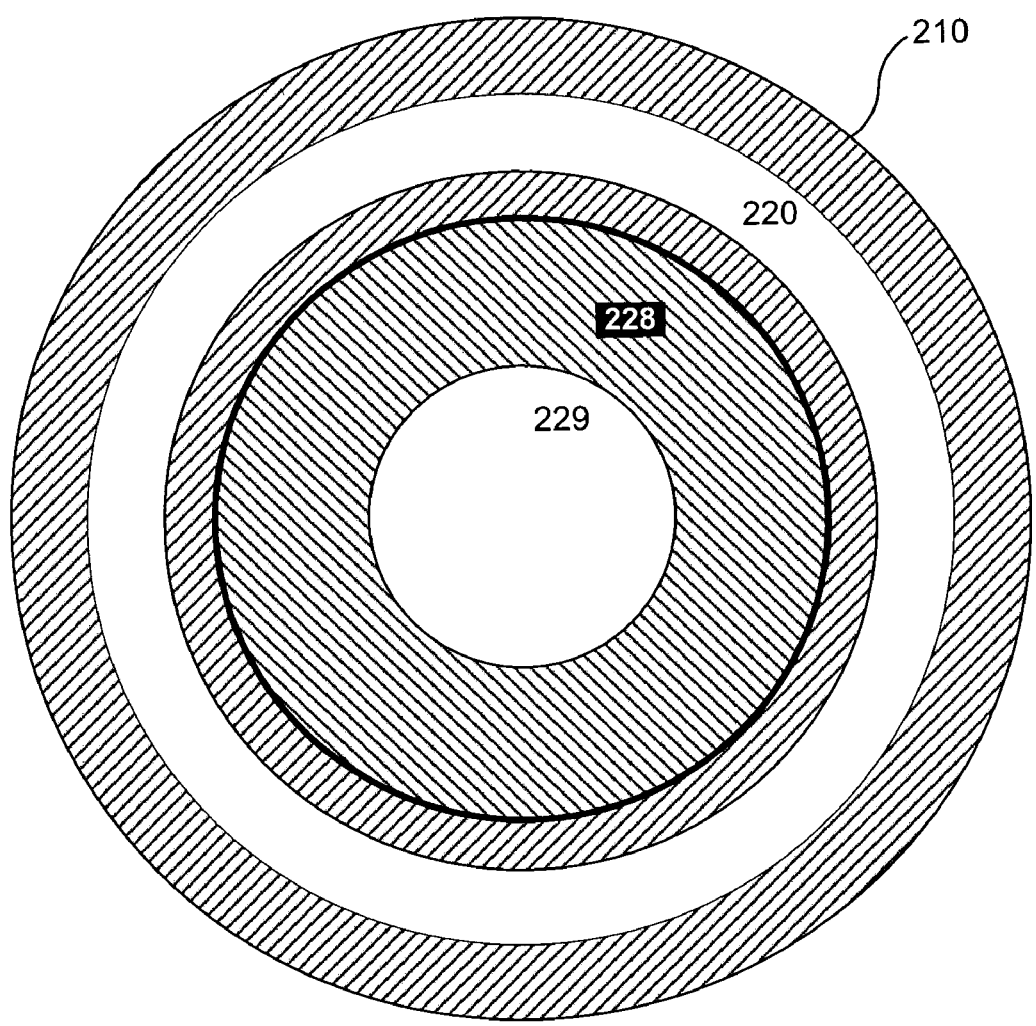
FIG. 4 is a diagram of a cross sectional view of a proximity sensor nozzle having a shroud that produces a flow curtain, according to an embodiment of the invention.

FIG. 4 is a diagram of a cross sectional view of shroud 210 and measurement nozzle 128. The cross section illustrates that plenum 220 fully encircles shroud 210. In other embodiments, multiple plenums can be used within shroud 210.

While the discussion above has focused primarily on the use of shroud 210 with a gas gauge proximity sensor, shroud 210 can also be used with an immersion lithography proximity sensor, such as, for example, the one disclosed in the '271 patent application. Additionally, the invention can be used with other types of nozzles that emit a gas or liquid in which the flow of the emitted gas or liquid needs to be protected from cross winds or cross currents.

When used in immersion lithography, plenum 220 would contain a shroud liquid. The shroud liquid would be emitted through holes 242 and 244 to form a liquid curtain that shields the flow of liquid from a measurement nozzle from cross-currents of liquid that may be occurring that would degrade performance. The specific location of holes, number of holes, angles of the holes, velocity of shroud liquid would be a function of a particular design application, as can be determined by individuals skilled in the relevant arts, based on the teachings herein.

CONCLUSION

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

What is claimed is:

1. An apparatus for reducing an impact of cross-winds on gas flow emitted from a nozzle, comprising:
a shroud substantially circumscribing the nozzle;
a plenum inside said shroud to hold a shroud gas;
wherein said shroud has a plurality of openings for emitting the shroud gas via said plenum in a direction away from the nozzle,
wherein said plurality of openings project cones of shroud gas flow having an arrival velocity, wherein horizontal components of the gas flow arrival velocity are equal to or greater than horizontal components of cross-winds, whereby creating a shroud gas curtain that prevents cross-winds from impacting gas flow emitted from the nozzle.

2. The apparatus of claim 1, wherein said plurality of openings face outward and downward at about a forty-five degree angle from a vertical centerline through the nozzle.

3. The apparatus of claim 1, wherein said plurality of openings project cones of shroud gas flow that form an continuous air curtain.

4. A gas gauge proximity sensor for sensing a difference between a reference surface standoff and a measurement surface standoff, comprising:
a junction that divides gas input into the gas gauge proximity sensor into a reference channel and a measurement channel;
a reference nozzle at an end of the reference channel, whereby gas exits the reference channel through the reference nozzle and travels across a reference standoff to impinge upon a reference surface;
a measurement nozzle at an end of the reference channel, whereby gas exits the measurement channel through the measurement nozzle and travels across a measurement standoff to impinge upon a measurement surface;

a measurement nozzle shroud affixed to said measurement nozzle, wherein said measurement nozzle shroud includes:
  a plenum inside said measurement nozzle shroud to hold the shroud gas; and
  a plurality of openings for emitting the shroud gas in a direction away from said measurement nozzle, wherein said plurality of openings project cones of shroud gas flow having an arrival velocity, wherein horizontal components of the gas flow arrival velocity are equal to or greater than horizontal components of cross-winds; and
a measurement device coupled between the reference and measurement channels for sensing the mass flow of gas flow therebetween, whereby, the differences in stand-offs between the reference and measurement surfaces can be sensed at a high sensitivity.

5. The gas gauge proximity sensor of claim 4, wherein said plurality of openings face outward and downward at about a forty-five degree angle from a vertical centerline through said measurement nozzle.

6. The gas gauge proximity sensor of claim 4, wherein said plurality of openings project cones of shroud gas flow that form an integrally continuous air curtain.

7. An apparatus for reducing an impact of cross-currents of liquid on a liquid flow emitted from a nozzle, comprising:
  a shroud substantially circumscribing the nozzle;
  a plenum inside said shroud to hold a shroud liquid;
  wherein said shroud has a plurality of openings for emitting the shroud liquid via said plenum in a direction away from the nozzle,
  wherein said plurality of openings project cones of shroud liquid flow having an arrival velocity, wherein horizontal components of the liquid flow arrival velocity are equal to or greater than horizontal components of cross-currents, whereby creating a shroud liquid curtain that prevents cross-currents from impacting liquid flow emitted from the nozzle.

8. The apparatus of claim 7, wherein said plurality of openings face outward and downward at about a forty-five degree angle from a vertical centerline through said nozzle.

9. The apparatus of claim 7, wherein said plurality of openings project cones of shroud liquid flow that form an integrally continuous liquid curtain.

10. An apparatus for reducing an impact of cross-winds on gas flow emitted from a nozzle, comprising:
  a shroud substantially circumscribing the nozzle;
  a plenum inside said shroud to hold a shroud gas;
  wherein said shroud has a plurality of openings for emitting the shroud gas via said plenum in a direction away from the nozzle,
  wherein said plurality of openings face outward and downward at an angle from a vertical centerline through the nozzle, whereby creating a shroud gas curtain that prevents cross-winds from impacting gas flow emitted from the nozzle.

11. An apparatus for reducing an impact of cross-currents of liquid on a liquid flow emitted from a nozzle, comprising:
  a shroud substantially circumscribing the nozzle;
  a plenum inside said shroud to hold a shroud liquid;
  wherein said shroud has a plurality of openings for emitting the shroud liquid via said plenum in a direction away from the nozzle,
  wherein said plurality of openings face outward and downward at an angle from a vertical centerline through the nozzle, whereby creating a shroud liquid curtain that prevents cross-currents from impacting liquid flow emitted from the nozzle.

* * * * *